(12) United States Patent
Shim

(10) Patent No.: US 8,237,100 B2
(45) Date of Patent: Aug. 7, 2012

(54) IMAGE SENSOR INCLUDING TWO IMAGE SENSING DEVICES IN A PIXEL AND METHOD FOR MANUFACTURING THE SAME

(75) Inventor: Hee Sung Shim, Gangwon-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 399 days.

(21) Appl. No.: 12/574,761

(22) Filed: Oct. 7, 2009

(65) Prior Publication Data
US 2010/0090093 A1    Apr. 15, 2010

(30) Foreign Application Priority Data
Oct. 14, 2008    (KR) .................. 10-2008-0100574

(51) Int. Cl.
*H01L 27/00* (2006.01)
*H01L 31/062* (2012.01)
(52) U.S. Cl. ..................................... 250/208.1; 257/292
(58) Field of Classification Search .............. 250/208.1, 250/214.1; 257/292; 348/274, 275
See application file for complete search history.

(56) References Cited

U.S. PATENT DOCUMENTS

| | | | |
|---|---|---|---|
| 2009/0200589 A1* | 8/2009 | Qian et al. | 257/292 |
| 2009/0294813 A1* | 12/2009 | Gambino et al. | 257/292 |

FOREIGN PATENT DOCUMENTS

| | | |
|---|---|---|
| KR | 10-2005-0117674 A | 12/2005 |
| KR | 10-2006-0076071 A | 7/2006 |
| KR | 10-2007-0043656 A | 4/2007 |

* cited by examiner

*Primary Examiner* — Thanh X Luu
(74) *Attorney, Agent, or Firm* — Saliwanchik, Lloyd & Eisenschenk

(57) ABSTRACT

An image sensor is provided. The image sensor comprises a readout circuitry, a first image sensing device, an interconnection, and a second image sensing device. The readout circuitry is disposed in a first substrate. The first image sensing device is disposed at one side of the readout circuitry of the first substrate. The interconnection is disposed over the first substrate and electrically connected to the readout circuitry. The second image sensing device is disposed over the interconnection.

12 Claims, 2 Drawing Sheets

IMAGE SENSOR INCLUDING TWO IMAGE SENSING DEVICES IN A PIXEL AND METHOD FOR MANUFACTURING THE SAME

CROSS-REFERENCE TO RELATED APPLICATION

This application claims the benefit under 35 U.S.C. §119 of Korean Patent Application No. 10-2008-0100574, filed Oct. 14, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be roughly classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding and forming a photodiode on and/or over the readout circuitry has been made (referred to as a "three-dimensional (3D) image sensor"). The photodiode is connected with the readout circuitry through a metal interconnection.

While the demand on CIS having a wide dynamic range that can simultaneously express bright light and dark light increases with the extension of applications of the CIS to automobile sensors as well as mobile phones, products that can meet the demand are deficient.

In addition, since both the source and the drain of the transfer transistor are heavily doped with N-type impurities in a related art, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity is reduced.

BRIEF SUMMARY

Embodiments provide an image sensor having wide dynamic range and a method for manufacturing the same using a 3D image sensor to increase fill factor and forming a high sensitivity sensor at an upper part of a wafer and a low sensitivity sensor at a lower part of the wafer.

Embodiments also provide an image sensor where a charge sharing does not occur while increasing a fill factor and a method for manufacturing the same.

Embodiments also provide an image sensor that can minimize a dark current source and inhibit saturation reduction and sensitivity degradation by forming a smooth transfer path of a photo charge between a photodiode and a readout circuit, and a method for manufacturing the same.

In one embodiment, an image sensor comprises: a readout circuitry in a first substrate; a first image sensing device at one side of the readout circuitry of the first substrate; an interconnection over the first substrate and electrically connected to the readout circuitry; and a second image sensing device over the interconnection.

In another embodiment, a method for manufacturing an image sensor comprises: forming a readout circuitry in a first substrate; forming a first image sensing device at one side of the readout circuitry of the first substrate; forming an interconnection over the first substrate and electrically connected to the readout circuitry; and forming a second image sensing device over the interconnection.

The details of one or more embodiments are set forth in the accompanying drawings and the description below. Other features will be apparent from the description and drawings, and from the claims.

DETAILED DESCRIPTION

Hereinafter, embodiments of an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
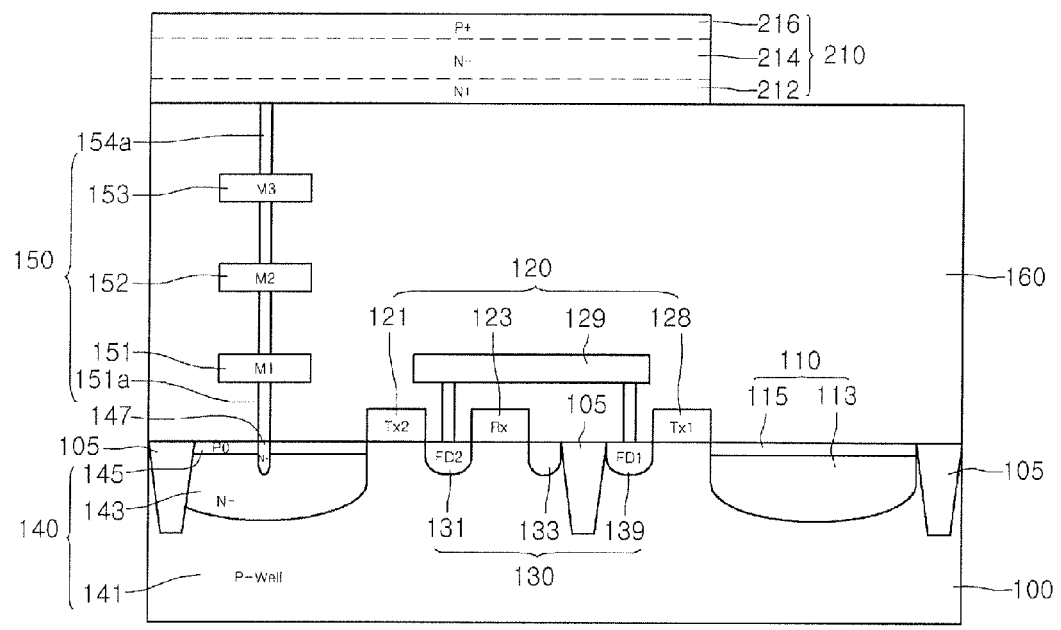
FIG. 1 is a cross-sectional view of an image sensor according to a first embodiment.

FIG. 1 is a cross-sectional view of an image sensor according to a first embodiment.

An image sensor according to the first embodiment may include: a readout circuitry 120 in a first substrate 100; a first image sensing device 110 at one side of the readout circuitry 120 of the first substrate 100; an interconnection 150 over the first substrate 100 and electrically connected to the readout circuitry 120; and a second image sensing device 210 over the interconnection 150 and electrically connected to the readout circuitry 120 through the interconnection 150.

The first image sensing device 110 and the second image sensing device 210 may be photodiodes, but, without being limited thereto, may be a photogate, or a combination of the photodiode and the photogate. Embodiments include a photodiode formed in a crystalline semiconductor layer as an example, but without being limited thereto, may include a photodiode formed in amorphous semiconductor layer.

Hereinafter, a method for manufacturing an image sensor according to an embodiment will be described with reference to FIG. 1.

Referring to FIG. 1, the first substrate 100 including the interconnection 150 and the readout circuitry 120 is prepared. For example, an active region is defined by forming a device isolation layer 105 in the first substrate 100. The readout circuitry 120 including a transistor is formed in the active region. For example, the readout circuitry 120 may include a first transfer transistor (Tx1) 128, a second transfer transistor (Tx2) 121, a reset transistor (Rx) 123, a drive transistor (Dx, not shown), and a select transistor (Sx, not shown).

An ion implantation region 130 including a first floating diffusion region (FD1) 139, a second floating diffusion region (FD2) 131, and a source/drain region 133 for each transistor may be formed.

In the first embodiment, the first image sensing device 110 may be formed at one side of the readout circuitry 120 of the first substrate 100. The first image sensing device 110 may include an N-well 113 and a P0 layer 115, but is not limited thereto.

In the first embodiment, the first floating diffusion region 139 with respect to the first image sensing device 110 and the second floating diffusion region 131 with respect to the second image sensing device 210 may be formed to have the same electric potential. For example, FD nodes may be designed to be shared by connecting the first floating diffusion region 139 and the second floating diffusion region 131 using a first metal 129.

The method for manufacturing an image sensor may further include forming an electrical junction region 140 in the first substrate 100, and forming a first conductive type connection 147 connected to the interconnection 150 at an upper part of the electrical junction region 140.

For example, the electrical junction region 140 may be a P-N junction 140, but is not limited thereto. For example, the electrical junction region 140 may include a first conductive type ion implantation layer 143 formed on a second conductive type well 141 or a second conductive type epitaxial layer, and a second conductive type ion implantation layer 145 formed on the first conductive type ion implantation layer 143. For example, the P-N junction 140 may be a P0(145)/N−(143)/P−(141) junction, but is not limited thereto. The first substrate 100 may be a second conductive type, but is not limited thereto.

According to an embodiment, the device is designed to provide a potential difference between the source and drain of the transfer transistor (Tx2), thus implementing the full dumping of a photo charge. Accordingly, a photo charge generated in the photodiode is dumped to the floating diffusion region (FD2), thereby increasing the output image sensitivity.

That is, referring to FIG. 1, the embodiment forms the electrical junction region 140 in the first substrate 100 including the readout circuit 120 to provide a potential difference between the source and drain of the second transfer transistor (Tx2) 121, thereby implementing the full dumping of a photo charge from the second image sensing device 210.

Thus, unlike the related art case of connecting a photodiode simply to an N+ junction, the embodiment makes it possible to inhibit saturation reduction and sensitivity degradation.

Thereafter, a first conductive type connection 147 is formed between the photodiode and the readout circuit to create a smooth transfer path of a photo charge, thereby making it possible to minimize a dark current source and inhibit saturation reduction and sensitivity degradation.

To this end, the first embodiment may form a first conductive type connection 147 for an ohmic contact on the surface of the P0/N−/P− junction 140. The N+ region (147) may be formed such that it pierces the P0 region (145) to contact the N− region (143).

The width of the first conductive type connection 147 may be minimized to inhibit the first conductive type connection 147 from being a leakage source. To this end, the embodiment may perform plug implant after etching a contact hole for a first metal contact 151a, but embodiments are not limited thereto. For example, an ion implantation pattern (not shown) may be formed by another method, and the ion implantation pattern may be used as an ion implantation mask to form the first conductive type connection 147.

That is, a reason why an N+ doping is performed only on a contact formation region is to minimize a dark signal and help the smooth formation of an ohmic contact. If the entire transfer transistor source region is N+ doped like the related art, a dark signal may increase due to an Si surface dangling bond.

An interlayer dielectric 160 may be formed on the first substrate 100, and an interconnection 150 may be formed. The interconnection 150 may include the first metal contact 151a, a first metal 151, a second metal 152, a third metal 153, and a fourth metal contact 154a, but is not limited thereto.

Next, a second image sensing device 210 is formed on the interconnection 150. The second image sensing device 210 may be formed on a crystalline semiconductor layer, but is not limited thereto. For example, the second image sensing device 210 may be formed using an amorphous type.

The second image sensing device 210 may include a high-concentration P-type conductive layer 216, a low-concentration N-type conductive layer 214, and a high-concentration N+-type conductive layer 212.

According to the first embodiment, the second image sensing device can increase fill factor by adopting a 3-D image sensor positioned at an upper side of the readout circuitry. Embodiments can inhibit defects in the image sensing device by forming the image sensing device in the crystalline semiconductor layer.

Figure 2:
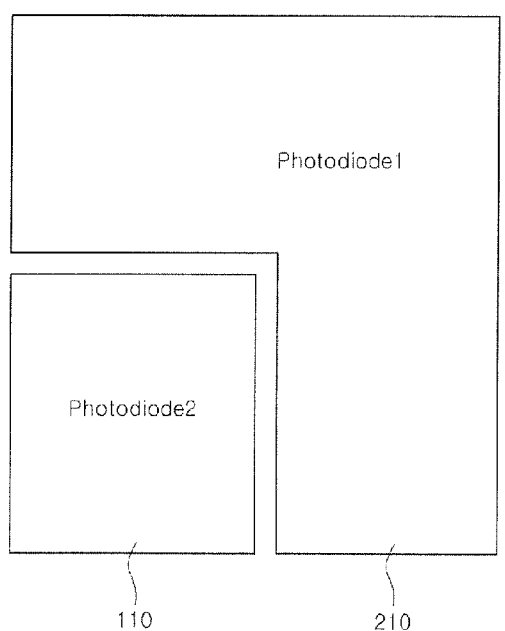
FIG. 2 is a plan view of an image sensor according to an embodiment.

FIG. 2 is a plan view of the image sensor according to an embodiment.

As shown in FIGS. 1 and 2, the second image sensing device 210 may be formed in a region except a region vertically positioned over the first image sensing device 110.

The second image sensing device 210, which is positioned at a higher region than the first image sensing device 110, may receive a greater incident light power than the first image sensing device 110 formed in the first substrate 100. Accordingly, the second image sensing device 210 may become a higher-sensitive sensor than the first image sensing device 110.

The sensitivity ratio of the second image sensing device 210 and the first image sensing device 110 may be adjusted by adjusting the area ratio of the second image sensing device 210 formed at an upper part of the chip and the first image sensing device 110 formed at a lower part of the chip.

By using a 3-D stack structure according to the embodiment, the readout circuitry part for the sharing structure of the first image sensing device 110 and the second image sensing device 210 is disposed under the region occupied by the second image sensing device 210, thereby increasing the fill factor of the image sensor.

Figure 3:
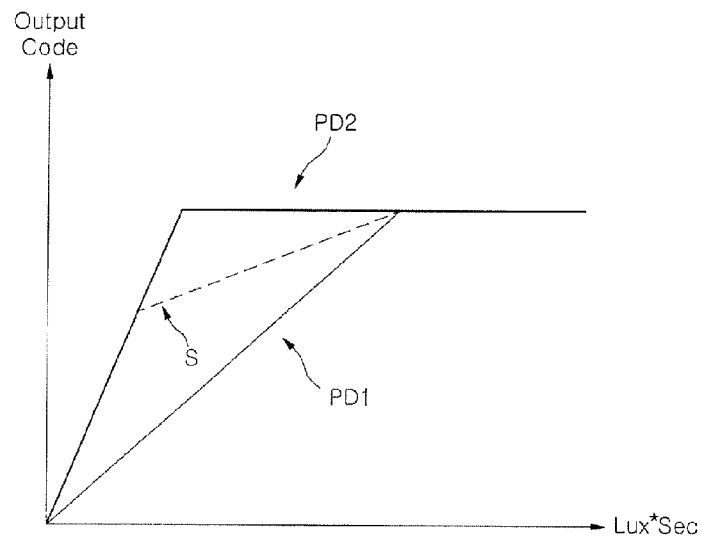
FIG. 3 is a graph illustrating a wide dynamic range of an image sensor in accordance with an embodiment.

FIG. 3 illustrates an exemplary result showing that dynamic range increases through dual slope using the structure of the image sensor according to the first embodiment.

Wide dynamic range can be implemented by designing FD nodes to be shared by a low-sensitive sensor and a high-sensitive sensor and synthesizing two types of sensitivity slopes acquired through a transfer transistor timing control.

As an example of synthesizing two types of information, a method of directly controlling the synthesis by a dual channel structure in an imaging device may be adopted, but embodiments are not limited thereto.

For example, in the dual channel structure, after image signals are generated or manipulated two or more times, the image signals are processed, and finally synthesized into one image signal. Specifically, a long channel takes charge of processing of a dark part, and a short channel takes charge of processing of a bright part. After signals obtained from a CIS are maximally preserved and processed, the signals are optimally synthesized according to dB of a monitor at the final stage.

Alternatively, in the method of direct control (of the synthesis) in the image device, the image device is directly exposed by units of pixel. Specifically, the method of direct control in the image device is a method in which the image device directly synthesizes a long channel signal of the dark part and a short channel signal of the bright part at a signal processing stage by controlling shutter timing, thereby acquiring a higher dynamic range using a simpler system than the dual channel structure.

By using the image sensor and the method of manufacturing the same according to embodiments, an image sensor having a wide dynamic range may be provided by simultaneously manufacturing a high-sensitivity pixel and a low-sensitivity pixel within a minimum area by a 3D image sensor.

Figure 4:
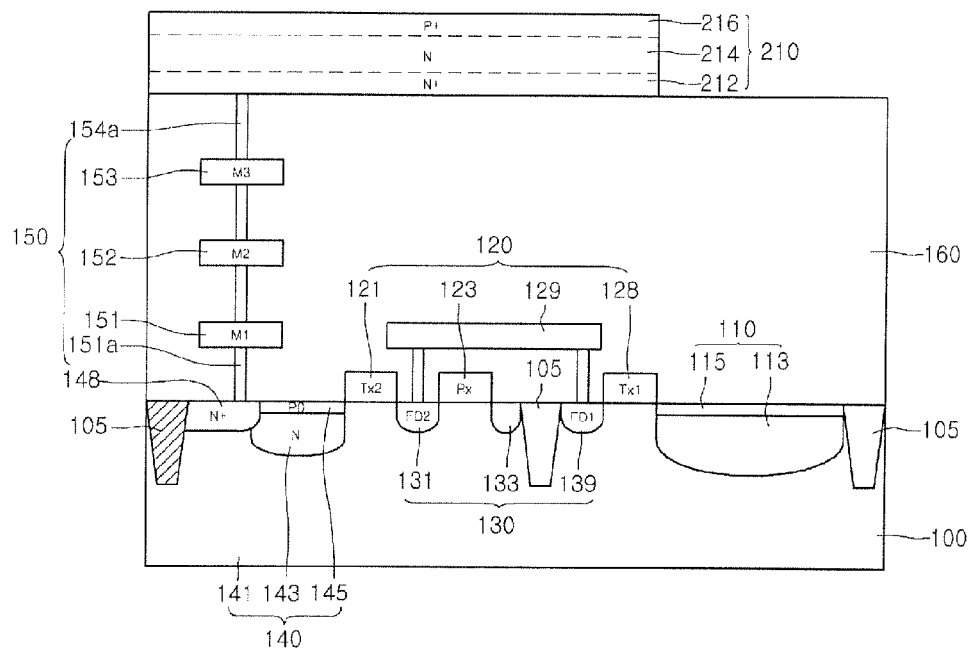
FIG. 4 is a cross-sectional view of an image sensor according to a second embodiment.

FIG. 4 is a cross-sectional view of an image sensor according to a second embodiment.

An image sensor according to the second embodiment may include: a readout circuitry 120 in a first substrate 100; a first image sensing device 110 at one side of the readout circuitry 120 of the first substrate 100; an interconnection 150 over the first substrate 100 and electrically connected to the readout circuitry 120; and a second image sensing device 210 over the interconnection 150.

The second embodiment may adopt the technical features of the first embodiment.

However, differently than the first embodiment, a first conductive type connection 148 is formed at one side of an electrical junction region 140.

An N+ connection region 148 may be formed at a P0/N−/P− junction 140 for an ohmic contact. A process of forming an N+ connection region and a first metal contact 151a may provide a leakage source. This is because an electric field (EF) may be generated over the Si surface due to operation while a reverse bias is applied to P0/N−/P− junction 140. A crystal defect generated during the contact forming process inside the electric field may become a leakage source.

Also, when the N+ connection region (see reference 147 of FIG. 1) is formed over the surface of P0/N−/P− junction 140, an electric field may be additionally generated due to N+/P0 junction. This electric field may also become a leakage source.

Therefore, the second embodiment proposes a layout in which first contact plug 151a is formed in an active region not doped with a P0 layer but including N+ connection region 148 that is connected to the N-junction 143.

According to the second embodiment, the electric field is not generated on and/or over the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry in a first substrate;
   a first image sensing device of a pixel at one side of the readout circuitry of the first substrate;
   an interconnection over the first substrate and electrically connected to the readout circuitry; and
   a second image sensing device of the pixel over the interconnection and electrically connected to the readout circuitry through the interconnection,
   wherein the second image sensing device of the pixel is formed at a region of the pixel except are region vertically positioned over the first image sensing device of the same pixel.

2. The image sensor according to claim 1, wherein the readout circuitry comprises a first floating diffusion region for photo charge dumping for the first image sensing device and a second floating diffusion region for photo charge dumping for the second image sensing device, wherein the first floating diffusion region and the second floating diffusion region have the same electric potential.

3. The image sensor according to claim 1, further comprising:
   an electrical junction region electrically connected to the readout circuitry at a second side of the readout circuitry, and
   a first conductive type connection between the electrical junction region and the interconnection for electrically connecting the interconnection to the electrical junction region.

4. The image sensor according to claim 3, wherein the electrical junction region comprises:
   a first conductive type ion implantation region over the first substrate; and
   a second conductive type ion implantation region over the first conductive type ion implantation region.

5. The image sensor according to claim 3, wherein the first conductive type connection is disposed at an upper part of the electrical junction region.

6. The image sensor according to claim 3, wherein the first conductive type connection is disposed at one side of the electrical junction region.

7. The image sensor according to claim 3, wherein the readout circuitry comprises a transistor, wherein the electrical junction region is disposed at a source of the transistor to provide a potential difference between the source and a drain of the transistor.

8. The image sensor according to claim 7, wherein the transistor is a transfer transistor, and an ion implantation concentration of the transistor's source is smaller than an ion implantation concentration of a floating diffusion region at the transistor's drain.

9. A method for manufacturing an image sensor, comprising:
- forming a readout circuitry in a first substrate;
- forming a first image sensing device of a pixel at one side of the readout circuitry of the first substrate;
- forming an interconnection over the first substrate and electrically connected to the readout circuitry; and
- forming a second image sensing device of the pixel over the interconnection,
- wherein forming the second image sensing device of the pixel comprises forming the second image sensing device in the pixel at a region of the pixel except a region vertically positioned over the first image sensing device of the same pixel.

10. The method according to claim 9, wherein forming the readout circuitry comprises forming a first floating diffusion region for photo charge dumping for the first image sensing device and forming a second floating diffusion region for photo charge dumping for the second image sensing device, wherein the first floating diffusion region and the second floating diffusion region are formed to have the same electric potential.

11. The method according to claim 9, further comprising forming an electrical junction region electrically connected to the readout circuitry at a second side of the readout circuitry before the forming of the interconnection.

12. The method according to claim 11, further comprising forming a first conductive type connection between the electrical junction region and the interconnection for electrically connecting the interconnection to the electrical junction region.

* * * * *